United States Patent
Fujiwara

(12) United States Patent (10) Patent No.: US 6,859,076 B2
Fujiwara (45) Date of Patent: Feb. 22, 2005

(54) COMBINATION TRIANGULAR WAVEFORM GENERATOR AND TRIANGULAR TO PSEUDO-SINUSOIDAL WAVEFORM CONVERTER CIRCUIT

(76) Inventor: Futoshi Fujiwara, Shearwater Kabushiki-Gaisya, Amano Building 2F, 2-27-5 Yayoicho, Nakanoku, Tokyo (JP), 161-0013

(*) Notice: Subject to any disclaimer, the term of this patent is extended or adjusted under 35 U.S.C. 154(b) by 0 days.

(21) Appl. No.: 10/657,688

(22) Filed: Sep. 8, 2003

(65) Prior Publication Data

US 2004/0085102 A1 May 6, 2004

Related U.S. Application Data

(60) Provisional application No. 60/409,893, filed on Sep. 10, 2002.

(51) Int. Cl.[7] .............................................. H03B 28/00
(52) U.S. Cl. ..................................................... 327/129
(58) Field of Search ................................. 327/127, 128, 327/129, 130, 131, 132, 133, 134, 135, 136, 137

(56) References Cited

U.S. PATENT DOCUMENTS

| 4,290,018 A | * | 9/1981 | Rhodes ........................ 324/255 |
| 5,756,919 A | * | 5/1998 | Adachi et al. ................. 84/660 |
| 6,483,356 B2 | * | 11/2002 | Suzuki et al. ................ 327/129 |
| 6,741,845 B1 | * | 5/2004 | Poletto et al. ............ 455/238.1 |

* cited by examiner

*Primary Examiner*—My-Trang Nu Ton
(74) *Attorney, Agent, or Firm*—Jackson Walker LLP; Michael G. Cameron, Esq.

(57) ABSTRACT

The present invention comprises an integral triangular voltage waveform generator (170, 180) and triangular to pseudo-sinusoidal current waveform converter (170, 180). The outputs of the present invention are preferably differential (130, 131), although the invention can easily be modified for single ended output. The frequency of the output waveforms corresponds to the frequency of the input reference clock.

20 Claims, 3 Drawing Sheets

*FIG. 6*
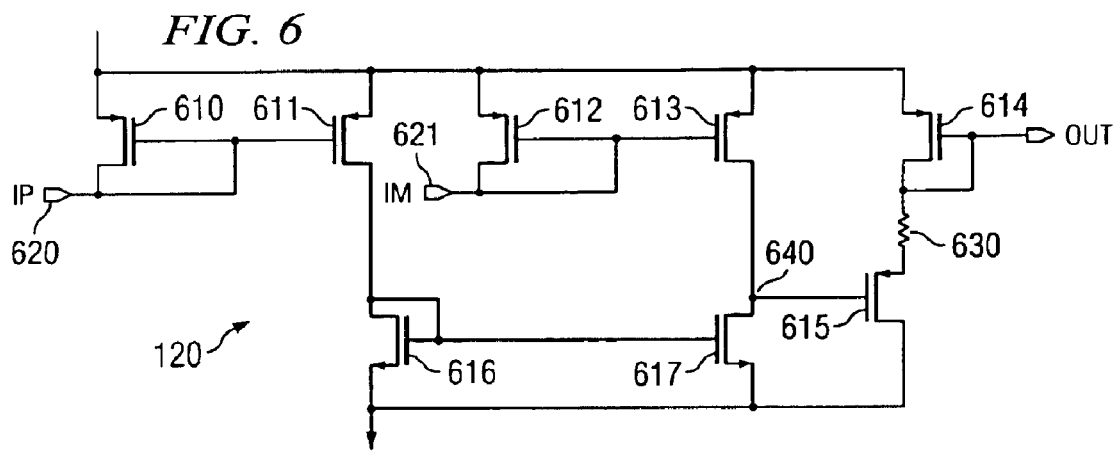
CLOCK 102
*FIG. 7A*
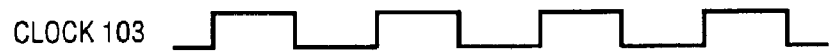
CLOCK 103
*FIG. 7B*
TRIANGULAR OUT 140
*FIG. 7C*
TRIANGULAR OUT 150
*FIG. 7D*
|TRIANGULAR OUT A|
*FIG. 7E*
|TRIANGULAR OUT B|
*FIG. 7F*
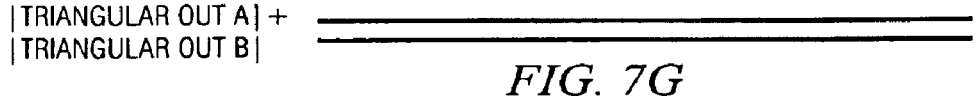
|TRIANGULAR OUT A| +
|TRIANGULAR OUT B|
*FIG. 7G*
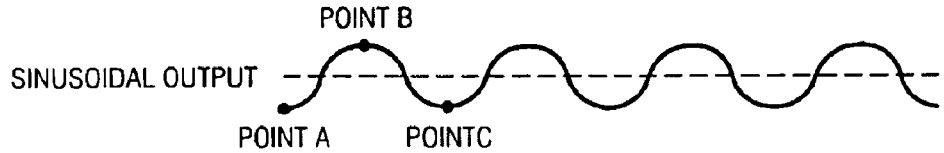
SINUSOIDAL OUTPUT
POINT B
POINT A  POINT C
*FIG. 7H*

COMBINATION TRIANGULAR WAVEFORM GENERATOR AND TRIANGULAR TO PSEUDO-SINUSOIDAL WAVEFORM CONVERTER CIRCUIT

CROSS REFERENCE TO RELATED APPLICATION

This application claims priority of U.S. Provisional Patent Application No. 60/409,893 filed on Sep. 10, 2002 entitled "Combination Triangular Waveform Generator and Triangular to Pseudo-Sinusoidal Waveform Converter Circuit" and the teachings thereof are incorporated herein by reference.

BACKGROUND OF THE INVENTION

Waveform generators are widely used in switching power supply devices, function generators, filter tuning circuitry and motor driving devices.

A conventional sinusoidal waveform generator generally comprises two stages. The first stage is a triangle waveform generator and the second stage is a converter which converts the triangular waveform to a sinusoidal waveform. The triangular waveform generator generally comprises a current source, a polarity switch and a means of capacitance, such as one or a plurality of capacitors. The triangular-to-sinusoidal converter generally comprises several diodes and resistors. The triangular-to-sinusoidal converter takes advantage of a diode's nonlinear function to rectify and shape the waveform.

Disadvantageously, the nonlinear functions of the diodes in the conventional triangular-to-sinusoidal converter typically require as many current paths as there are diodes. As a result, the triangular-to-sinusoidal converter has high power consumption. Further, the number of diodes and resistors in the triangular-to-sinusoidal converter affects the surface area of the converter. In addition, an integrator, which requires a device with large capacitance, also affects the surface area. Not surprisingly, then, the surface area is typically large in comparison to the surface area taken by other elements in a circuit.

More specifically, the conventional triangular-to-sinusoidal converter comprises several sub-stage elements. The first sub-stage element comprises an up-down counter with an input and output. A continuous triangular wave is fed into the up-down counter input and converted into a digital triangular wave which is made available on its output. A second sub-stage element is coupled to the output of the first sub-stage element. The second sub-stage element is a read only memory ("ROM"), also having an input and an output. The digital triangular waveform is taken from the output of the first sub-stage element and is fed into the input of the ROM. The digital triangular wave is converted into a digital sinusoidal waveform and made available on the output of the ROM. A third sub-stage element coupled to the output of the second sub-stage element is a digital-to-analog converter. The third sub-stage element accepts the digital sinusoidal waveform and converts it to a continuous analog sinusoidal waveform at the output. The fourth sub-stage element is a post analog filter with an input and an output. It accepts the continuous sinusoidal waveform on the input and outputs a smoother sinusoidal signal. As noted, the sinusoidal waveform generator disadvantageously requires a large surface area for the placement of its constituent components. The high power consumption of the triangular-to-sinusoidal waveform generator is attributable to the requirements of the up-down counter, read only memory, digital to analog converter and post analog filter.

SUMMARY OF THE INVENTION

Because of the surface area and power consumption disadvantages of the conventional triangular-to-sinusoidal waveform converter circuit, a small, fairly non-complex triangular waveform generator and pseudo-sinusoidal waveform converter circuit is desired. The present invention comprises a triangular voltage waveform generator and triangular to pseudo-sinusoidal current waveform converter. The outputs of the present invention are preferably differential, although the invention can easily be modified for single ended output. The frequency of the output waveforms corresponds to the frequency of the input reference clock.

The present invention can be viewed as being comprised of three sub-circuits. The first sub-circuit is a triangular waveform generator for the generation of two triangular waveforms. The second sub-circuit is an amplitude control circuitry that controls the amplitude of triangular waveform needed to generate a pseudo-sinusoidal waveform. The third sub-circuit is a reference voltage circuit which controls the amplitude control circuitry. This third sub-circuit is operable to generate reference voltages for the peak voltages of the triangular waveform.

The present invention advantageously utilizes one circuit to generate two kinds of waveforms. The triangular waveform voltage is generated from an external digital clock and its current is controlled by the circuitry of the present invention. Further, the common voltage of the triangular waveforms is self-controlled by the circuit using feedback.

This circuit topology can also be utilized as a differential current mirror. The pseudo-sinusoidal waveform current is converted from a triangular waveform by the triangular waveform converter to a pseudo sinusoidal waveform in the circuit.

BRIEF DESCRIPTION OF THE DRAWINGS

FIG. 6 is a circuit diagram of a current comparator and current generator as seen in FIG. 1; and FIG. 7 is a timing diagram of the present invention.

DETAILED DESCRIPTION OF THE PRESENT INVENTION

Figure 1:
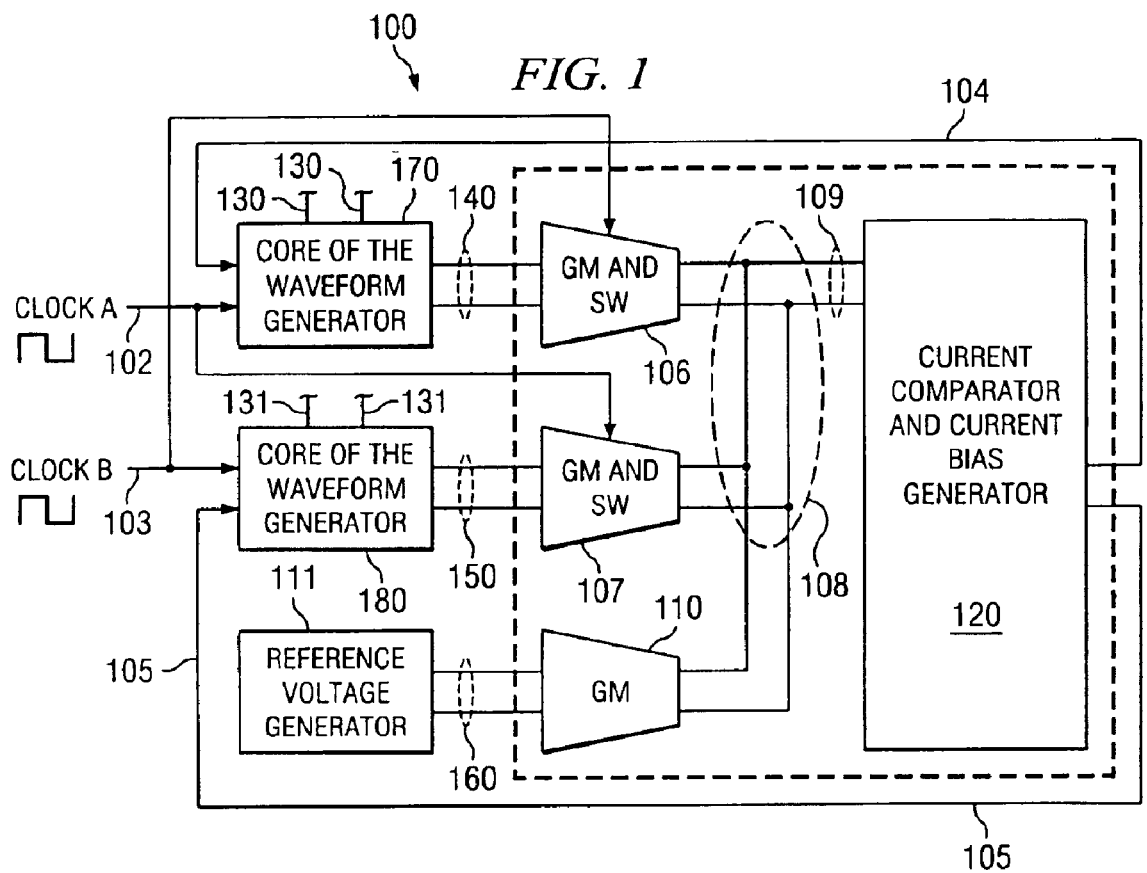
FIG. 1 is an overall block diagram of triangular waveform generator and the triangular to pseudo-sinusoidal waveform converter of the present invention.

The present invention comprises two waveform generators, a reference voltage generator and amplitude control circuitry. Generally, a separate reference clock signal is applied to the input of each of the two waveform generators, there being a 90 degree phase difference between the two clock signals. Further, reference currents are supplied to the two waveform generators from the amplitude control circuitry. The waveform generators combine the reference currents and the clock signals into two triangular waveforms with 90 degrees phase difference. The reference currents determine the amplitude of the triangular waveform.

Two reference voltages, one for high side, the other for the low side, are generated in the reference voltage circuitry. The two reference voltages are supplied to the amplitude control circuitry which generates the reference currents to compare to the triangular waveform amplitude. The amplitude control circuitry also rectifies the triangular waveform and derives the amplitude of the triangular waveform. It continuously compares the reference voltage to the amplitude of the triangular waveform to control the supply of the reference currents for the waveform generator. The amplitude control circuitry is operable to ensure that the amplitude of the triangular waveform remains constant.

The second sub-circuit comprises the voltage-to-current converter, rectifier and current comparator. As noted, two triangular waveforms are generated by the triangular waveform generators. These two triangular waveforms have 90 degree of phase offset from each other and have same amplitude. The waveform voltages and reference voltages are converted into current signals by the voltage to current converter. The value of the triangular waveform amplitude is added to the absolute value of each triangular waveforms in the rectifier. This derived amplitude is compared to the converted current from the reference voltages. The comparator, which has limited gain, directly controls the reference current of the waveform generator. The advantage of this method is that the amplitude of the triangular waveform can be compared to the reference voltage continuously. This method results in high rectifier efficiency.

The conventional method of generating a pseudo-sinusoidal waveform compares both peaks of the triangular waveform to the reference voltage for a moment. As such, the conventional method requires an integrator at the compared output due to the need of the comparator to compare the amplitude of the triangular waveform to the reference voltage in discrete time. Because the comparator has limited speed, the short time comparison causes a frequency dependence of the amplitude.

The third sub-circuit of the present invention comprises the sinusoidal waveform converter. A maximum peak to peak voltage of the triangular waveform has to be an appropriate input voltage for the sinusoidal waveform converter. The appropriate input voltage for the sinusoidal waveform converter is defined as the maximum voltage that will not saturate the output current of the sinusoidal waveform converter. Consequently, the level of current that will not saturate the output current of the sinusoidal waveform is the maximum output current.

In operation, target differential currents are input into the output nodes of the sinusoidal waveform converter. The objective appropriate input voltage is the balance of the target output current with input current provided by a feed-back connection. The foregoing operation of the present invention is more specifically described in the following detailed descriptions of the drawings.

As seen in FIG. 1, clock signal A 102 and clock signal B 103 are input to the core of the waveform generators 170 and 180. These clock signals have 90 degrees phase difference as seen in FIG. 7A and FIG. 7B. Reference currents 104 and 105 are input to the core of the waveform generators 170 and 180. The core of the waveform generators 170 and 180 generate triangular waveforms 140, 150 and sinusoidal waveforms 130 and 131 as also seen in FIG. 7H, from input currents 104 and 105 and clock signal 102 and clock signal 103. These triangular waveforms, as also seen in FIG. 7C and FIG. 7D have same amplitude and 90 degrees phase difference. The triangular waveforms 140 and 150 are provided to the inputs of the voltage-to-current converters 106 and 107. In addition, reference voltage 160 is generated in the reference voltage generator 110. The reference voltages 160 are input to the voltage-to-current generator 111. Currents from the voltage-to-current generator 110 and from the core of the waveform generators 170 and 180 are input to switches inside of the voltage to current converters 106 and 107. The respective switches are driven by the other side's clock signal 103 and 102. This configuration controls the absolute value of the output, as seen in FIGS. 7E and 7F. Output currents from voltage-to-current generators 106, 107 and 110 are summed at node 108, as seen in FIG. 7G and are provided to the input of the current comparator and current bias generator 120. The current comparator therein compares the input differential currents at input 109. If the current is less than 0, a current bias generator within current comparator and current bias generator 120 increases the reference currents 104 and 105. As such, the amplitude of triangular waveform will be increased.

The equations governing rectifier operation is as follows:

Triangular waveform (tri) phase = 0

$$tri(\phi) = \frac{\phi}{\pi} + \frac{1}{2} \quad @ \quad -\pi \leq \phi < 0$$

$$tri(\phi) = -\frac{\phi}{\pi} + \frac{1}{2} \quad @ \quad 0 \leq \phi < \pi$$

Triangular waveform (tri) phase = $\frac{\pi}{2}$ $$tri(\phi + \frac{\pi}{2}) = -\frac{\phi}{\pi} - 1 \quad @ \quad -\pi \leq \phi < -\frac{\pi}{2}$$

$$tri(\phi + \frac{\pi}{2}) = \frac{\phi}{\pi} \quad @ \quad -\frac{\pi}{2} \leq \phi < \frac{\pi}{2}$$

$$tri(\phi + \frac{\pi}{2}) = -\frac{\phi}{\pi} + 1 \quad @ \quad \frac{\pi}{2} \leq \phi < \pi$$

This calculation results in the following:

$$|tri(\phi)| + |tri(\phi + \frac{\pi}{2})| = -\left(\frac{\phi}{\pi} + \frac{1}{2}\right) - \left(-\frac{\phi}{\pi} - 1\right) = \frac{1}{2} \quad @ \quad -\pi \leq \phi < -\frac{\pi}{2}$$

$$|tri(\phi)| + |tri(\phi + \frac{\pi}{2})| = \left(\frac{\phi}{\pi} + \frac{1}{2}\right) - \left(\frac{\phi}{\pi}\right) = \frac{1}{2} \quad @ \quad -\frac{\pi}{2} \leq \phi < 0$$

$$|tri(\phi)| + |tri(\phi + \frac{\pi}{2})| = \left(-\frac{\phi}{\pi} + \frac{1}{2}\right) + \left(\frac{\phi}{\pi}\right) = \frac{1}{2} \quad @ \quad 0 \leq \phi < \frac{\pi}{2}$$

$$|tri(\phi)| + |tri(\phi + \frac{\pi}{2})| = -\left(-\frac{\phi}{\pi} + \frac{1}{2}\right) + \left(-\frac{\phi}{\pi} + 1\right) = \frac{1}{2} \quad @ \quad \frac{\pi}{2} \leq \phi < \pi$$

The bias voltage is generated in the current bias generator of current comparator and current bias generator 120.

Figure 2:
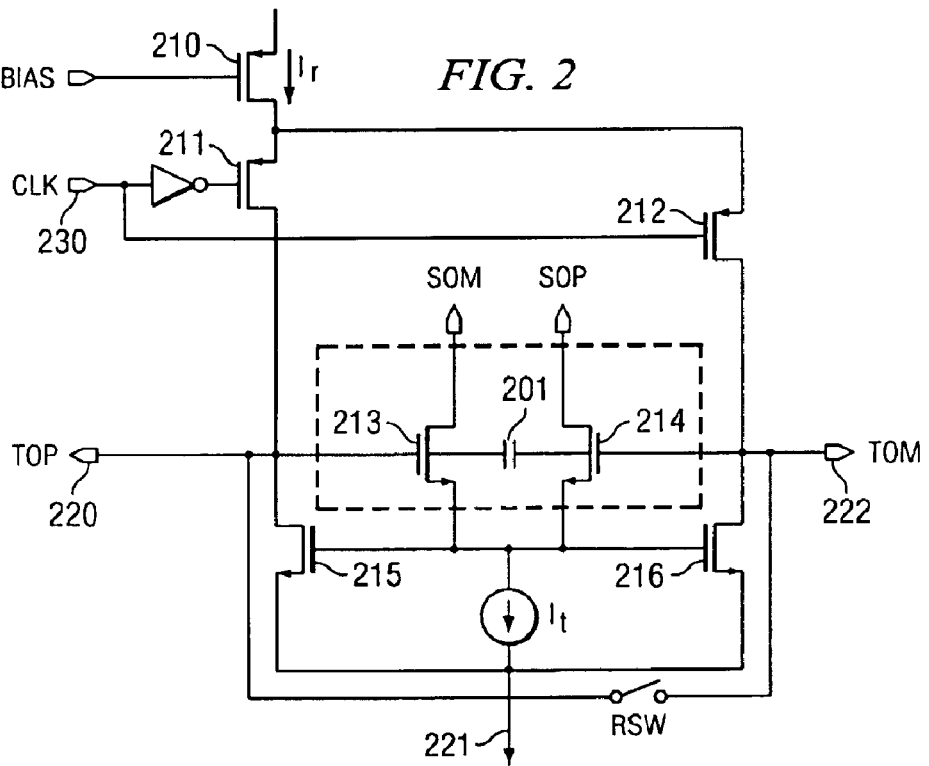
FIG. 2 is a circuit diagram of the sinusoidal waveform and triangular waveform generator.

The circuitry of waveform generator 170 is shown in FIG. 2. As seen in FIG. 2, the terms top and tom refer to the nodes for the triangular waveform differential voltage outputs. The terms sop and som refer to the nodes for the sinusoidal differential current waveform outputs. As seen in FIG. 2, the current to charge the capacitor 201 is generated with transistor 210 from the bias voltage. The capacitor 201 is connected as differential. It can be easily modified as single-ended. For example, two capacitors are connected between top and GND and between tom and GND. All transistors used herein are preferably MOSFETs, although other transistor compositions can be used. The current is defined as Ir. A clock signal is provided to the circuit at input pin clk. The clock signal is supplied to the gate of transistor 212 for switching. The inverted clock signal is supplied to gate of transistor 211 for switching. As seen in FIG. 2, the sources of transistor 211 and transistor 212 are coupled. In operation, if transistor 211 is on, then transistor 222 is off, because when clk is high, the inverter output is low. Current Ir flows from the source of transistor 211 through the drain of the transistor 211. The source coupled transistor 211 and transistor 212 result in a differential current. It is this differential current that charges capacitor 201. As a result, voltage at the node top 220 is increased. The drain current of transistor 215 and transistor 216 are equal, because the both gate-source voltages are equal. Transistors 215 and 216 generate common current. In order to increase the voltage of the node top 220, the gate-source voltage of transistor 215 and transistor 216 must increase because the coupled sources of transistor 213 and transistor 214 are connected to the gates of transistor 215 and transistor 216. When the voltage of tom is decreased, the drain current of transistor 216 charges capacitor 201 and the voltage at node tom 222 is decreased. The differential voltage across capacitor 201 thus increases and the drain current of transistor 213 increases. The drain current of transistor 214 decreases as the voltage across capacitor 201 increases. The differential voltage across capacitor 201 is first order linear, because a constant current charges the capacitor 201. The drain current of transistor 213 and transistor 214 is given by the differential transistor pair V-I characteristic, because the differential voltage between the gate of transistor 213 and the gate of transistor 214 increases in a linear first order manner. The current through transistor 213 increases from point A to point B as seen in FIG. 7H.

If transistor 212 is on and transistor 211 is off, the current Ir flows from the source of transistor 212 through the drain of transistor 212. From there, the same operation as described above occurs. The current through transistor 213 is decreased from point B to point C as seen in FIG. 7H.

Figure 3:
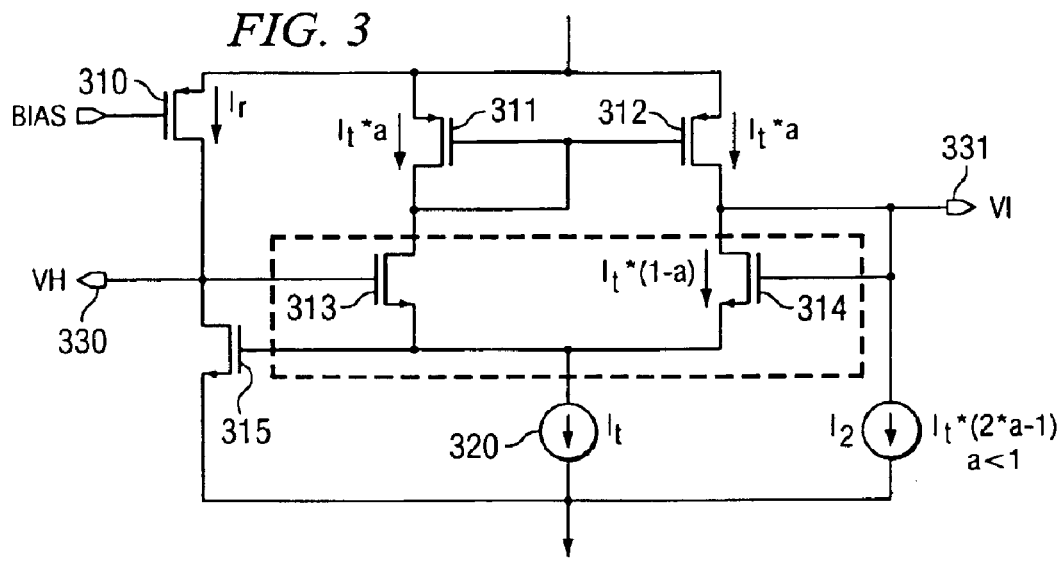
FIG. 3 is a circuit diagram of the reference voltage generator.

FIG. 3 illustrates current Ir supplied by current generator transistor 310 which is controlled by the bias voltage that is generated in current bias generator of current comparator and current bias generator 120 of FIG. 1. Transistor 313 and transistor 314 as seen in FIG. 3 correspond to the main differential pair transistors 213 and 214 as seen in FIG. 2. Transistor 315 in FIG. 3 corresponds to transistor 215 of FIG. 2.

"It" refers to the tail current for the maximum output current of the sinusoidal current waveform. It can be controlled to set the current amplitude of the sinusoidal waveform. Current It of current source 320 in FIG. 3 is same current as It as seen in FIG. 2. Transistor 313 and transistor 314 share the current It from current source 320 as seen in FIG. 3. The current It*a from flows through transistor 313. The current It*a is mirrored by the current mirror generator transistor 311 to transistor 312. The current It*(2*a-1) is subtracted from the mirrored current It*a. Finally, transistor 314 shares part of current It*(1-a). In operation, the gate-source voltages of transistor 313 and transistor 314 are determined. The "a" refers to the distortion control coefficient. The value of "a" is set for the appropriate amplitude of the triangular waveform. If "a" is 99%, the current ratio of transistor 313 to transistor 314 is 99:1, and transistor 314 is slightly ON. The current ratio of transistor 313 and transistor 314 determines the voltage difference between node VH 330 and node VL 331. When "a" is a large ratio that is less than 100%, VH-VL refers to the maximum peak-to-peak voltage of the triangular waveform. When "a" is a small ratio that is more than 0%, VL-VH refers to the maximum peak-to-peak voltage of the triangular waveform. In order to reduce the MOSFETs back-gate effect on transistor 313 and transistor 314, the gate-source voltage of the transistor 315 in FIG. 3 must have the same gate-source voltage of transistor 315 in FIG. 2. Current Ir from transistor 310 generates the same gate-source voltage of transistor 315 as the gate-source voltage of transistor 315 as seen in FIG. 2.

Figure 4:
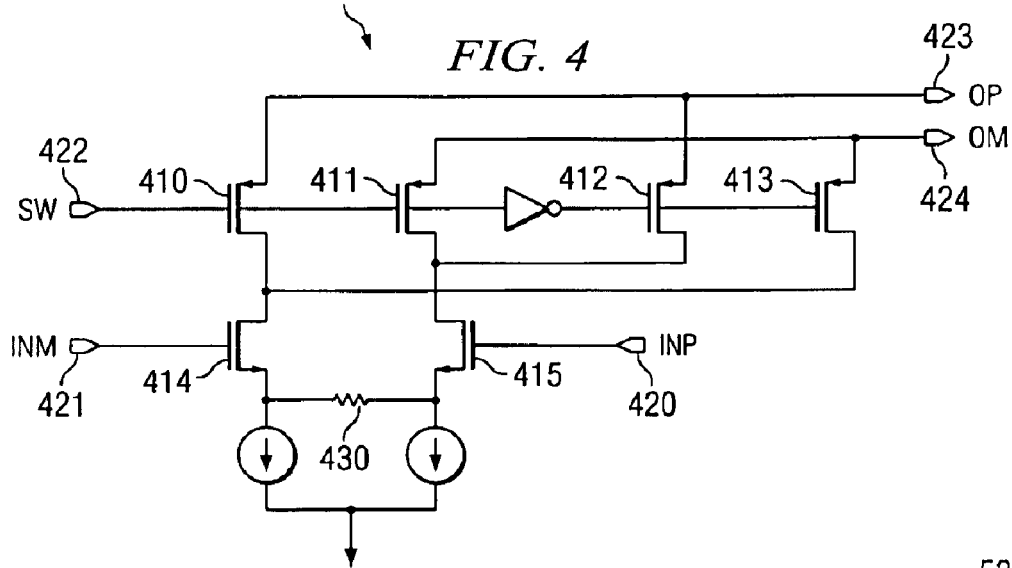
FIG. 4 is a circuit diagram of a voltage to current converter utilizing a NOT gate switch.

FIG. 4 illustrates the voltage-to-current converter and the switches necessary to rectify the triangular waveform. The transistor 410, transistor 411, transistor 412 and transistor 413 are employed as switches to transmit currents directly or to exchange currents. As seen in FIG. 4, the triangular waveform differential voltages are input to node inp 420 and node inm 421. Also as seen therein, node inp 420 and node inm 421 are connected to gates of transistor 414 and transistor 415. Resistor 430 is coupled to the sources of transistor 414 and transistor 415. The differential input voltage appears as the voltage across resistor 430. Resistor 430 generates a current that is proportional to the differential input voltage. The current flows through the sources through the drains of transistor 414 and transistor 415. As seen in FIG. 4, "sw" refers to the input for swapping the polarity of the output currents. When node sw 422 is high transistor 410 and transistor 411 turn off and transistor 412 and transistor 413 turn on. When the input at node sw 422 is low, the current flows in transistors 410, or transistor 411 to node op 423 and node om 424. The terms om and op refer to the current output. When the input at node sw 422 is high, the current flows in transistors 412 or transistor 413, to node om 422 and node op 423.

Figure 5:
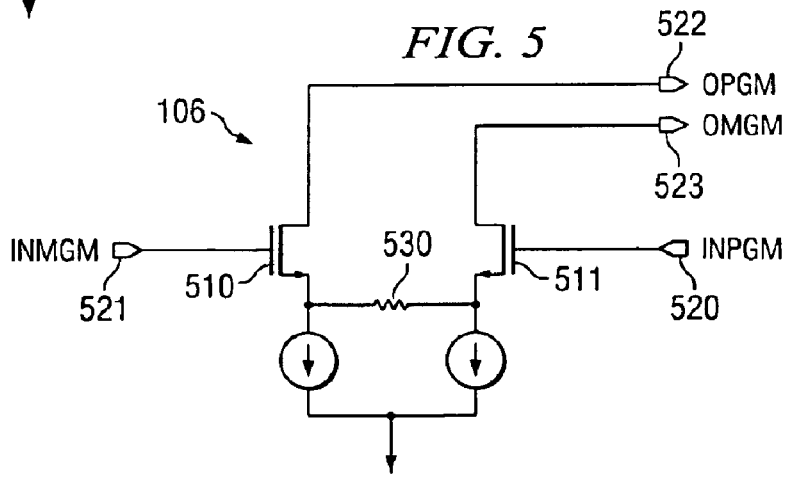
FIG. 5 is a circuit diagram of a voltage to current converter.

FIG. 5 illustrates the operation of the voltage-to-current converters. The reference differential voltages are input to node inpgm 520 and node inmgm 521. As seen therein, node inpgm 520 and node inmgm 521 are connected to the gates of transistor 510 and transistor 511. Resistor 530 is coupled to the sources of transistor 510 and transistor 511. The differential input voltage appears as the voltage across resistor 530. Resistor 530 generates a current that is proportional to the input differential reference voltage. The current flows through the source to the drain of transistor 510 and transistor 511, to node opgm 522 and node omgm 523.

FIG. 6 illustrates the current comparator and current bias voltage generator 120 of FIG. 1. As seen therein, current is applied at node ip 620 and node im 621. The current input from node ip 620 is mirrored by current mirror generator transistor 610 to transistor 611.

The mirrored current is also mirrored by current mirror transistor 616 to transistor 617. The current input at node im 621 is mirrored by current mirror transistor 612 to transistor 613. In operation, the current mirrored by transistor 617 subtracts from the current mirrored by transistor 613. The node cmpo 640 is an output of the current comparator that has high output resistance. Node cmpo 640 has a finite output resistance that is determined by the parallel output resistance of transistor 617 and transistor 613. This finite output resistance determines the trans-resistance of this comparator. The trans-conductance of the voltage-to-current converter and this trans-resistance makes a finite gain of the comparator on node cmpo 640. The voltage of the node cmpo 640 generates a reference current with the resistor 630. The current generates the reference bias voltage of the core of the triangular waveform generator.

What I claim is:

1. A waveform generator circuit, comprising:
   a triangular and pseudo-sinusoidal waveform generator adapted to accept clock signals and generate triangular waveforms;
   an amplitude control current responsively coupled to the triangular and pseudo-sinusoidal waveform generator operable to control the amplitude of the generated triangular waveforms;

a reference voltage circuit responsively coupled to the amplitude control circuit, operable to generate reference voltages for the peak voltages of the triangular waveform;

the triangular and pseudo-sinusoidal waveform generator operable to accept one or a plurality of clock signals;

the triangular and pseudo-sinusoidal waveform generator further operable to generate triangular waveforms from the clock signals, the triangular and pseudo-sinusoidal waveform generator further operable to rectify the triangular waveforms;

the triangular and pseudo-sinusoidal waveform generator further operable to smooth the triangular waveforms into pseudo-sinusoidal waveforms.

2. The waveform generator circuit of claim 1, further comprising the triangular and pseudo-sinusoidal waveform generator being adapted to receive two clock signals with a 90 degree phase difference between them.

3. The waveform generator circuit of claim 1, further comprising the triangular and pseudo-sinusoidal waveform generator being adapted to output a differential signal.

4. The waveform generator circuit of claim 1, further comprising the triangular and pseudo-sinusoidal waveform generator being adapted to output a single ended signal.

5. The waveform generator circuit of claim 1, further comprising being adapted for use in a switching power supply.

6. The waveform generator circuit of claim 1, wherein the frequency of the output waveforms corresponds to the frequency of the input reference clock.

7. The waveform generator circuit of claim 1, wherein the common voltage of the triangular waveforms is self-controlled by the circuit using feedback.

8. The waveform generator circuit of claim 1, further comprising being adapted for use as a differential current mirror.

9. The waveform generator circuit of claim 1, further comprising:

the reference voltage circuitry generating two reference voltages, one for high side, the other for the low side;

the reference voltage circuitry being operable to supply the two reference voltages to the amplitude control circuitry;

the amplitude control circuitry being operable to generate reference currents to compare to the triangular waveform amplitude;

the amplitude control circuitry being operable to rectify the triangular waveforms and derive the amplitude of the triangular waveforms;

the amplitude circuitry being operable to continuously compare the reference voltage to the amplitude of the triangular waveform to control the supply of the reference currents to the waveform generator; and the amplitude control circuitry being operable to ensure that the amplitude of the triangular waveform remains constant.

10. The waveform generator circuit of claim 9, further comprising a voltage-to-current converter responsively coupled to the triangular and pseudo-sinusoidal waveform generator;

a rectifier within the triangular and pseudo-sinusoidal waveform generator;

and a current comparator responsively coupled to the triangular and pseudo-sinusoidal waveform generator;

the voltage to current converter being operable to convert the waveform voltages and reference voltages into current signals;

the rectifier being operable to add the value of the triangular waveform amplitude to the absolute value of each triangular waveforms to obtain a derived amplitude;

the comparator being operable to compare the derived amplitude to the converted current from the reference voltages;

the comparator having a limited gain;

the comparator being operable to directly control the reference current of the waveform generator.

11. The waveform generator circuit of claim 1, wherein the triangular and pseudo-sinusoidal waveform generator further comprises:

a triangular waveform generator;

a sinusoidal waveform converter responsively coupled to the triangular waveform generator;

the sinusoidal waveform generator being adapted to accept a triangular waveform from the triangular waveform generator; and the triangular waveform having a maximum voltage that will not saturate the output current of the sinusoidal waveform converter.

12. The waveform generator circuit of claim 11, wherein the sinusoidal waveform generator further has output nodes operable to accept predetermined differential currents.

13. The waveform generator circuit of claim 1, wherein the triangular and pseudo-sinusoidal waveform generator further comprises:

two triangular waveform differential voltage output nodes "top" and "tom";

two sinusoidal differential current waveform output nodes "sop" and "som";

a first transistor and a second transistor, the sources of the first transistor and second transistor being coupled;

an clock output node coupled to the gate of the second transistor;

the gate of the first transistor being adapted to receive an inverted clock signal for switching purposes;

the gate of the second transistor being adapted to receive a clock signal for switching purposes;

when the clock signal is high and the inverter output is low, the first transistor is on, and the second transistor is off;

the first transistor and second transistor being coupled such that current Ir from a current source flows from the source of the first transistor through the drain of the first transistor;

the source coupled first transistor and second transistor being operable to result in a differential current;

a capacitor coupled to the drain of the second transistor so as to be charged by the differential current, resulting in the voltage at node "top" being increased;

a third transistor and a fourth transistor coupled at their sources;

a fifth transistor and sixth transistor being coupled at their gates and at their sources;

the fifth transistor and sixth transistor being coupled such that the drain current of the fifth transistor and sixth transistor are equal, as both gate-source voltages are equal;

the fifth transistor and sixth transistor being operable to generate common current;

the fifth transistor and sixth transistor being coupled such that when the voltage of the node "top" is increased, the gate-source voltage of the fifth transistor and sixth transistor must increase as the coupled sources of the third transistor and fourth transistor are connected to the gates of the fifth transistor and sixth transistor;

the circuit being operable such that when the voltage at node "tom" is decreased, the drain current of the sixth transistor charges the capacitor;

the circuit further being operable such that when the differential voltage across the capacitor increases, the drain current of the third transistor increases;

the circuit further being operable such that the drain current of the fourth transistor decreases as the voltage across the capacitor increases; and the drain current of the third transistor and fourth transistor being given by the differential transistor pair V-I characteristic.

14. The waveform generator circuit of claim 13, further comprising the first, second, third, fourth, fifth and sixth transistors comprising MOSFETs.

15. The waveform generator circuit of claim 13, further comprising the first, second, third, fourth, fifth and sixth transistors comprising BJTs.

16. The waveform generator circuit of claim 1, wherein a voltage-to-current converter and a plurality of switches are operable to rectify the triangular waveform, comprising:

a first plurality of transistors configured as switches to transmit currents directly or to exchange currents;

a second plurality of transistors adapted to accept triangular waveform differential voltages at their gates;

a resistor coupled to the second plurality of transistors, the differential input voltage appearing as the voltage across the resistor;

the resistor operable to generate a current proportional to the differential input voltage, the current flowing through the sources and through the drains of the second plurality of transistors; and a means of swapping the polarity of the output currents at a node such that when the node is high, a set of switches turn on and others turn off.

17. A method of generating a waveform, comprising:

inputting a first clock signal and a second clock signal 90 degrees out of phase with the first clock signal into a waveform generator;

inputting a reference current into the waveform generator;

generating a first triangular waveform and a second triangular waveform that is 90 degrees out of phase from said first triangular waveform from said first clock signal and second clock signal;

inputting said first triangular waveform and second triangular waveform to a first and second voltage-to-current converter;

generating a first and second reference voltage in a reference voltage generator;

summing the first and second reference voltages to the first and second voltage-to-current converters, respectively;

inputting the first and second currents from the first and second voltage-to-current converters respectively and from the first and second waveform generators to a first and second switch, or plurality thereof, inside of the first and second voltage-to-current converters;

driving the first and second switch or plurality thereof by the clock signal of the other side controlling the absolute value of the output by summing the output currents from the voltage-to-current converters at a node;

providing the summed current to the input of a current comparator and current bias generator;

comparing the input differential currents at an input node;

increasing a reference current if the current is less than 0 at the input node and hence increasing the amplitude of triangular waveform;

decreasing a reference current if the current is more than a predetermined amount at the input node and hence decreasing the amplitude of triangular waveform; and rectifying and shaping the triangular waveform to obtain a pseudo-sinusoidal waveform based.

18. The method of generating a waveform of claim 17, further comprising being operable to serve as a differential current mirror circuit.

19. The method of generating a waveform of claim 18, further comprising being adapted for use in a switching power supply.

20. The method of generating a waveform of claim 18, further comprising being adapted for use in a motor driving circuit.

* * * * *